(12) United States Patent
Wang et al.

(10) Patent No.: US 10,644,038 B2
(45) Date of Patent: May 5, 2020

(54) ARRAY SUBSTRATE, DISPLAY PANEL, AND DISPLAY DEVICE THEREOF

(71) Applicant: SHANGHAI AVIC OPTOELECTRONICS CO., LTD., Shanghai (CN)

(72) Inventors: Tinghai Wang, Shanghai (CN); Huijun Jin, Shanghai (CN); Dandan Qin, Shanghai (CN); Rili Fei, Shanghai (CN); Ying Xie, Shanghai (CN)

(73) Assignee: SHANGHAI AVIC OPTO ELECTRONICS CO., LTD., Shanghai (CN)

( * ) Notice: Subject to any disclaimer, the term of this patent is extended or adjusted under 35 U.S.C. 154(b) by 109 days.

(21) Appl. No.: 16/049,961

(22) Filed: Jul. 31, 2018

(65) Prior Publication Data

US 2019/0304999 A1 Oct. 3, 2019

(30) Foreign Application Priority Data

Mar. 27, 2018 (CN) .......................... 2018 1 0260555

(51) Int. Cl.
*G06F 3/044* (2006.01)
*H01L 27/12* (2006.01)

(52) U.S. Cl.
CPC ............ *H01L 27/124* (2013.01); *G06F 3/044* (2013.01); *G09G 2320/0233* (2013.01)

(58) Field of Classification Search
None
See application file for complete search history.

(56) References Cited

U.S. PATENT DOCUMENTS

| | | | | |
|---|---|---|---|---|
| 7,329,990 B2* | 2/2008 | Park | ......................... | H01J 11/12 313/500 |
| 8,102,349 B2* | 1/2012 | Ashizawa | ............. | G02F 1/1345 345/92 |
| 9,036,121 B2* | 5/2015 | Itoh | ................... | G02F 1/136286 349/139 |
| 9,164,336 B2* | 10/2015 | Kinoe | ............... | G02F 1/136209 |
| 9,858,860 B2* | 1/2018 | Cho | ..................... | G09G 3/3233 |
| 10,216,052 B2* | 2/2019 | Shin | ..................... | G02F 1/13452 |
| 10,360,862 B2* | 7/2019 | Yeh | ....................... | G09G 3/3666 |
| 2004/0130269 A1* | 7/2004 | Park | ......................... | H01J 11/12 313/586 |

(Continued)

FOREIGN PATENT DOCUMENTS

JP 2010164765 A 7/2010

*Primary Examiner* — Chad M Dicke
(74) *Attorney, Agent, or Firm* — Anova Law Group PLLC (57) ABSTRACT

An array substrate, a display panel, and a display device are provided. The array substrate includes a display region and a non-display region surrounding the display region. The array substrate also includes a plurality of gate lines. The plurality of gate lines include a plurality of regular gate lines and at least one irregular gate line. The plurality of regular gate lines are disposed in the display region and extended along a first direction. The at least one irregular gate line includes at least one first trace portion and a second trace portion electrically connected to each other. The at least one first trace portion has a same line width as a regular gate line of the plurality of regular gate lines, and the second trace portion has a line width smaller than the at least one first trace portion.

17 Claims, 10 Drawing Sheets

(56) References Cited

U.S. PATENT DOCUMENTS

| | | | |
|---|---|---|---|
| 2010/0156945 A1* | 6/2010 | Yoshida | G02F 1/1345 345/690 |
| 2016/0111040 A1* | 4/2016 | Kim | G02F 1/13454 345/698 |
| 2017/0249896 A1* | 8/2017 | Kim | G09G 3/3225 |
| 2018/0067356 A1* | 3/2018 | Katsuta | G02F 1/1345 |
| 2018/0204889 A1* | 7/2018 | Yu | G09G 3/3233 |
| 2018/0308417 A1* | 10/2018 | Xie | G09G 3/3266 |
| 2019/0005915 A1* | 1/2019 | Liu | G02F 1/13454 |
| 2019/0079625 A1* | 3/2019 | Wang | G06F 3/0412 |
| 2019/0121211 A1* | 4/2019 | Luo | G02F 1/136286 |
| 2019/0131360 A1* | 5/2019 | Lee | G09G 3/3233 |
| 2019/0235334 A1* | 8/2019 | Wu | G02F 1/136286 |

* cited by examiner

ARRAY SUBSTRATE, DISPLAY PANEL, AND DISPLAY DEVICE THEREOF

CROSS-REFERENCES TO RELATED APPLICATIONS

This application claims the priority of Chinese patent application No. 201810260555.8, filed on Mar. 27, 2018, the entirety of which is incorporated herein by reference.

FIELD OF THE DISCLOSURE

The present disclosure generally relates to the field of display technology and, more particularly, relates to an array substrate, display panel and display device thereof.

BACKGROUND

In daily life, more and more rich visual information are utilized by people and, thus display technology plays a very important role in today's human society. With the development of science and technology, display technology is rapidly advancing toward narrow borders and full display. In an existing display panel, a display region has a non-rectangular shape. Along a length direction of a gate line, a width of the display region is not uniform. Thus, the gate lines in the display region in the display panel will have different length and, accordingly, corresponding load capacitance will be different. The load capacitance of the gate line affects a signal transmission time, which results in different signal delay between the gate lines having different lengths. Different signal delay may degrade picture quality.

The disclosed array substrate, display panel and display device are directed to solve one or more problems set forth above and other problems.

BRIEF SUMMARY OF THE DISCLOSURE

One aspect of the present disclosure provides an array substrate. The array substrate includes a display region and a non-display region surrounding the display region. The display region includes a first edge, and the first edge is recessed toward interior of the display region to form a display notch portion and at least one display protrusion portion. The non-display region includes a first non-display region arranged adjacent to the first edge. The array substrate also includes a plurality of gate lines. The plurality of gate lines include a plurality of regular gate lines and at least one irregular gate line. The plurality of regular gate lines are disposed in the display region and extended along a first direction. The at least one irregular gate line includes at least one first trace portion and a second trace portion electrically connected to each other, the at least one first trace portion is disposed in the display protrusion portion and extended along the first direction, and the second trace portion is disposed in the first non-display region. The at least one first trace portion has a same line width as a regular gate line of the plurality of regular gate lines, and the second trace portion has a line width smaller than the at least one first trace portion.

Another aspect of the present disclosure provides a display panel. The display panel includes an array substrate. The array substrate includes a display region and a non-display region surrounding the display region. The display region includes a first edge, and the first edge is recessed toward interior of the display region to form a display notch portion and at least one display protrusion portion. The non-display region includes a first non-display region arranged adjacent to the first edge. The array substrate also includes a plurality of gate lines. The plurality of gate lines include a plurality of regular gate lines and at least one irregular gate line. The plurality of regular gate lines are disposed in the display region and extended along a first direction. The at least one irregular gate line includes at least one first trace portion and a second trace portion electrically connected to each other, the at least one first trace portion is disposed in the display protrusion portion and extended along the first direction, and the second trace portion is disposed in the first non-display region. The at least one first trace portion has a same line width as a regular gate line of the plurality of regular gate lines, and the second trace portion has a line width smaller than the at least one first trace portion.

Another aspect of the present disclosure provides a display device. The display device includes a display panel including an array substrate. The array substrate includes a display region and a non-display region surrounding the display region. The display region includes a first edge, and the first edge is recessed toward interior of the display region to form a display notch portion and at least one display protrusion portion. The non-display region includes a first non-display region arranged adjacent to the first edge. The array substrate also includes a plurality of gate lines. The plurality of gate lines include a plurality of regular gate lines and at least one irregular gate line. The plurality of regular gate lines are disposed in the display region and extended along a first direction. The at least one irregular gate line includes at least one first trace portion and a second trace portion electrically connected to each other, the at least one first trace portion is disposed in the display protrusion portion and extended along the first direction, and the second trace portion is disposed in the first non-display region. The at least one first trace portion has a same line width as a regular gate line of the plurality of regular gate lines, and the second trace portion has a line width smaller than the at least one first trace portion.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

Figure 1:
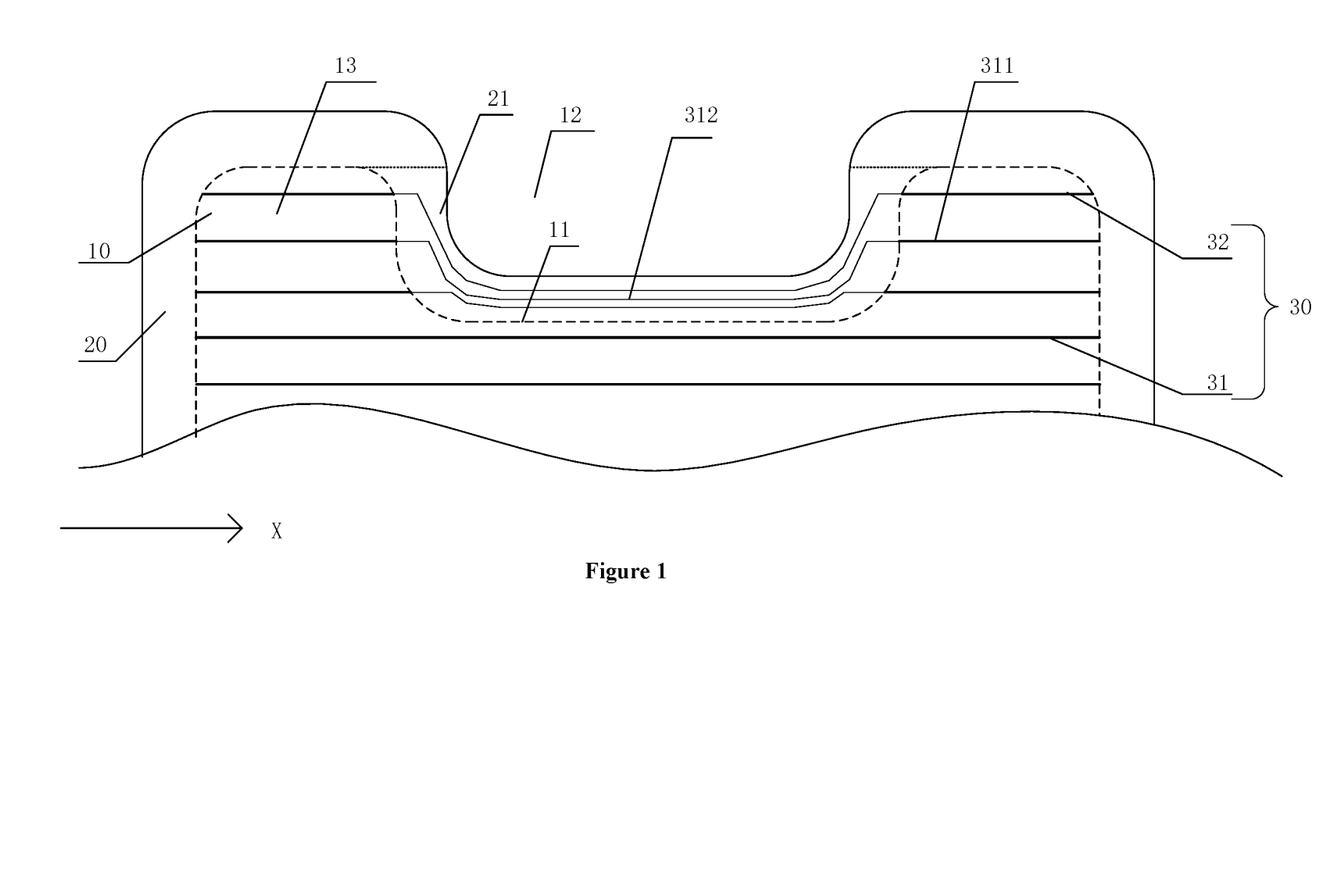
FIG. 1 illustrates a schematic diagram of a local structure of an exemplary array substrate consistent with disclosed embodiments of the present disclosure.

FIG. 1 illustrates a schematic diagram of a local structure of an exemplary array substrate consistent with disclosed embodiments of the present disclosure. Referring to FIG. 1, the array substrate may include a display region 10 and a non-display region 20 surrounding the display region 10. The display region 10 may include a first edge 11. The first edge 11 may be recessed toward interior of the display region 10 to form a display notch portion 12 and at least one display protrusion portion 13. The non-display region 20 may include a first non-display region 21, and the first non-display region 21 may be arranged adjacent to the first edge 11.

The array substrate may also include a plurality of gate lines 30. The plurality of gate lines 30 may include a plurality of regular gate lines 31 and at least one irregular gate line 32. The plurality of regular gate lines 31 may be disposed in the display region 10 and extended along a first direction X. The irregular gate line 32 may include at least one first trace portion 311 and a second trace portion 312 electrically connected to the first trace portion 311. The first trace portion 311 may be disposed in the display protrusion portion 13 and extended along the first direction X. The second trace portion 312 may be disposed in the first non-display region 21. The first trace portion 311 may have a same line width as the regular gate line 31, and the second trace portion 312 may have a line width smaller than the first trace portion 311.

In one embodiment, referring to FIG. 1, the array substrate may include the display region 10 and the non-display region 20. The display region 10 may include the first edge 11. The first edge 11 may be recessed toward the interior of the display region 10 to form the display notch portion 12 and the two display protrusion portions 13. The display notch portion 12 may be disposed between the two display protrusion portions 13. FIG. 1 illustrates a case where two display protrusion portions 13 are provided, and in practical applications, any appropriate quantities of the display protrusion portions 13 may be provided according to various applications, which are not limited by the present disclosure. The non-display region 20 may include the first non-display region 21, and the first non-display region 21 may be arranged adjacent to the first edge 11.

The array substrate may also include the plurality of regular gate lines 31 and at least one irregular gate line 32. The plurality of regular gate lines 31 may be disposed in the display region 10. The second trace portion 312 in the irregular gate line 32 may be disposed in the first non-display region 21, due to the presence of the display notch portion 12 and the two display protrusion portions 13.

The array substrate, for example, may further include a plurality of data lines. The plurality of data lines may intersect with the plurality of gate lines to form a pixel array. The pixel array may include, for example, a plurality of multi-row and multi-column pixel units. The pixel units in a same column may be connected to a same data line, and the pixel units in a same row may be connected to a same gate line.

The second trace portion 312 in the irregular gate line 32 may be disposed in the first non-display region 21, and the first trace portion 311 in the irregular gate line 32 may be disposed in the display region 10. In existing array substrate, when the second trace portion 312 has the same line width as the regular gate line 31, the regular gate line 31 may have a load capacitance greater than the irregular gate line 32, which may cause the regular gate line 31 to have a charging delay different from the irregular gate line 32. Accordingly, horizontal stripes or even a split screen may appear on the display screen.

In view of this, in the disclosed embodiments, the first trace portion 311 in the irregular gate line 32 may be configured to have the same line width as the regular gate line 31, and the second trace portion 312 may be configured to have the line width smaller than the first trace portion 311. In other words, the second trace portion 312 may be configured to have the line width smaller than the regular gate line 31, such that a resistance of the second trace portion 312 may increase. Accordingly, the load capacitance of the irregular gate line 32 may be increased, and the regular gate line 31 may have the same load capacitance as the irregular gate line 32, which may improve the uniformity of the display panel, and improve the display performance of the display panel.

Figure 2:
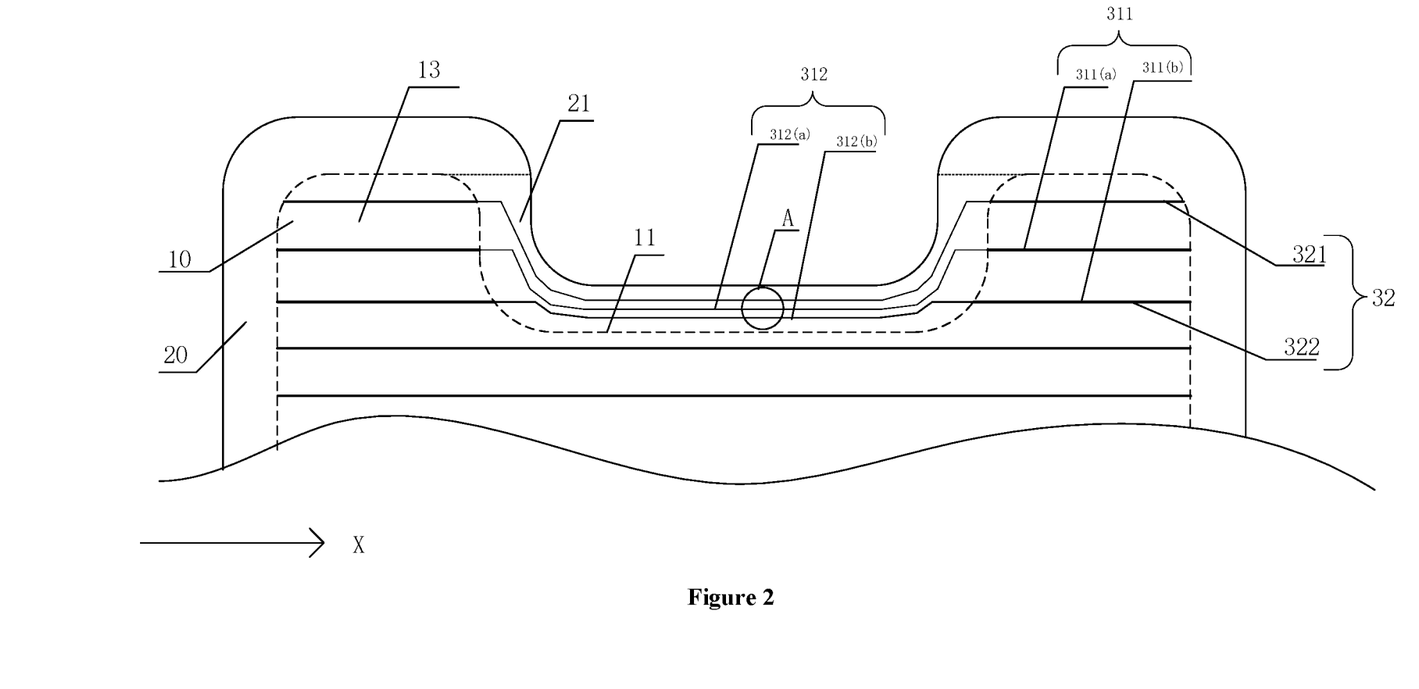
FIG. 2 illustrates a schematic diagram of a local structure of another exemplary array substrate consistent with disclosed embodiments of the present disclosure.
Figure 3:
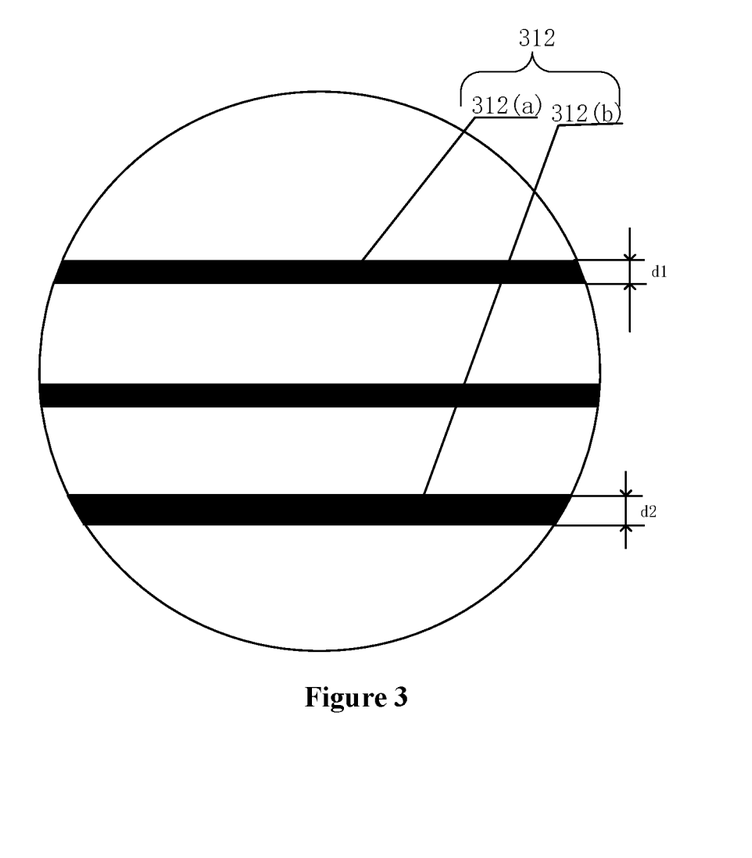
FIG. 3 illustrates an enlarged view of part A of another exemplary array substrate in FIG. 2 consistent with disclosed embodiments of the present disclosure.

FIG. 2 illustrates a schematic diagram of a local structure of another exemplary array substrate consistent with disclosed embodiments of the present disclosure, and FIG. 3 illustrates an enlarged view of part A of another exemplary array substrate in FIG. 2.

In one embodiments, referring to FIG. 2 and FIG. 3, the array substrate may include a plurality of irregular gate lines 32. The plurality of irregular gate lines 32 may include at least one first irregular gate line 321 and at least one second irregular gate line 322. A first trace portion 311 (*a*) of the first irregular gate line 321 may have a length smaller than a first trace portion 311 (*b*) of the second irregular gate line 322. A second trace portion 312 (*a*) of the first irregular gate line 321 may have a line width smaller than a second trace portion 312 (*b*) of the second irregular gate line 322.

In particular, referring to FIG. 2, both the first irregular gate line 321 and the second irregular gate line 322 may be the irregular gate lines 32. FIG. 2 illustrates a case where two first irregular gate lines 321 and one second irregular gate line 322 are provided, which are for illustrative purposes and are not intended to limit the scope of the present application. In practical applications, any appropriate quantities of the first irregular gate lines 321 and any appropriate quantities of the second irregular gate lines 322 may be provided according to various application scenarios.

The first trace portion 311 (a) of the first irregular gate line 321 and the first trace portion 311 (b) of the second irregular gate line 322 may be disposed in the display protrusion portion 13 and extended along the first direction X. The first trace portion 311 (a) of the first irregular gate line 321 may have a length smaller than the first trace portion 311 (b) of the second irregular gate line 322. The first trace portion 311 (a) of the first irregular gate line 321 may have a same line width as the first trace portion 311 (b) of the second irregular gate line 322. The second trace portion 312 (a) of the first irregular gate line 321 and the second trace portion 312 (b) of the second irregular gate line 322 may be disposed in the first non-display region 21. The second trace portion 312 (a) of the first irregular gate line 321 may have a line width smaller than the second trace portion 312 (b) of the second irregular gate line 322.

The first trace portion 311 (a) of the first irregular gate line 321 may have the length smaller than the first trace portion 311 (b) of the second irregular gate line 322, and the first trace portion 311 (a) of the first irregular gate line 321 may have the same line width as the first trace portion 311 (b) of the second irregular gate line 322. In existing array substrate, when the second trace portion 312 (a) of the first irregular gate line 321 has the same line width as the second trace portion 312 (b) of the second irregular gate line 322, the first irregular gate line 321 may have a load capacitance smaller than the second irregular gate line 322, which may cause the irregular gate line 321 to have a charging delay different from the second irregular gate line 322. Accordingly, horizontal stripes or even a split screen may appear on the display panel.

In view of this, in the disclosed embodiments, the second trace portion 312 (a) of the first irregular gate line 321 may be configured to have the line width smaller than the second trace portion 312 (b) of the second irregular gate line 322. Both the line widths of the second trace portion 312 (a) and the second trace portion 312 (b) may be smaller than the line width of the regular gate line 31. Accordingly, the second trace portion 312 (a) may have a resistance greater than the second trace portion 312 (b), and the first irregular gate line 321 may have a same load capacitance as the second irregular gate line 322, which may improve the uniformity of the display panel, and improve the display performance of the display panel.

In one embodiment, referring to FIG. 3, the second trace portion 312 (b) of the second irregular gate line 322 may have the line width of approximately 4 µm, and the second trace portion 312 (a) of the first irregular gate line 321 may have the line width in a range of approximately 3 µm-3.5 µm.

The second trace portion 312 (a) of the first irregular gate line 321 may have the line width smaller than the second trace portion 312 (b) of the second irregular gate line 322. In one embodiment, the second trace portion 312 (b) of the second irregular gate line 322 may have the line width of 'd2', and 'd2' may be approximately 4 µm. The second trace portion 312 (a) of the first irregular gate line 321 may have the line width of 'd1', and 'd1' may be in a range of approximately 3 µm-3.5 µm.

Figure 4:
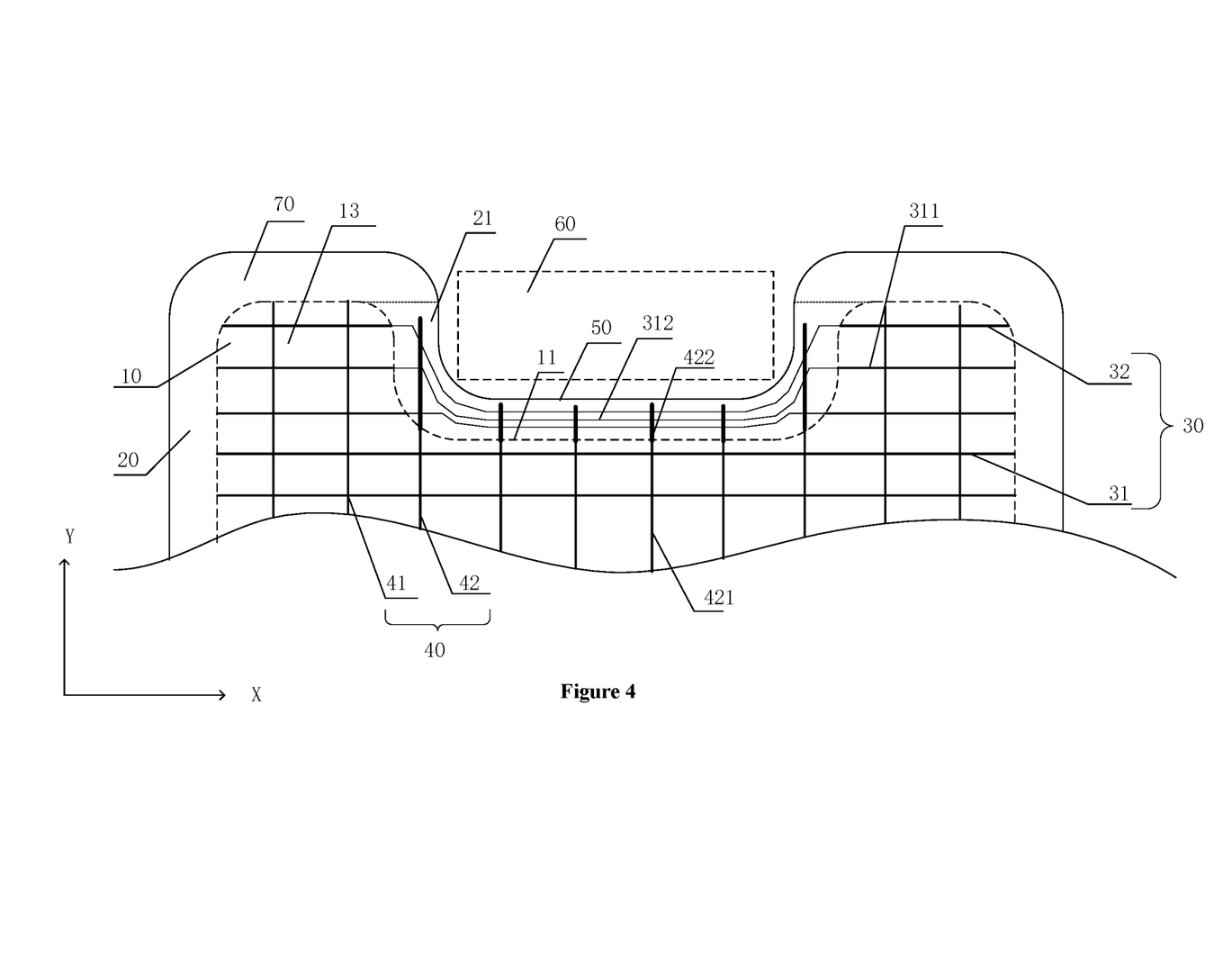
FIG. 4 illustrates a schematic diagram of a local structure of another exemplary array substrate consistent with disclosed embodiments of the present disclosure.

FIG. 4 illustrates a schematic diagram of a local structure of another exemplary array substrate consistent with disclosed embodiments of the present disclosure. In one embodiment, referring to FIG. 4, the array substrate may further include a plurality of signal lines 40. The signal lines 40 may be extended along a second direction Y, and the first direction X may intersect with the second direction Y.

The plurality of signal lines 40 may include a plurality of first signal lines 41 and at least one second signal line 42. The plurality of first signal lines 41 may be disposed in the display region 10. The second signal line 42 may include a first sub-portion 421 and a second sub-portion 422. The first sub-portion 421 may be disposed in the display region 10, and the second sub-portion 422 may be disposed in the first non-display region 21. The first signal line 41 may have a same line width as the first sub-portion 421 of the second signal line 42, and the second sub-portion 422 may have a line width greater than the first sub-portion 421.

In one embodiment, referring to FIG. 4, the array substrate may include the display region 10 and the non-display region 20. The non-display region 20 may include the first non-display region 21. The array substrate may also include the plurality of regular gate lines 31 and at least one irregular gate line 32. The plurality of regular gate lines 31 may be disposed in the display region 10. The second trace portion 312 of the irregular gate line 32 may be disposed in the first non-display region 21, due to the presence of the display notch portion 12 and the display protrusion portions 13. The second trace portion 312 disposed in the first non-display region 21 may have the line width smaller than the first trace portion 311 disposed in the display protrusion portion 13.

In addition, the array substrate may include the plurality of signal lines 40. The plurality of signal lines 40 may include the plurality of first signal lines 41 and the at least one second signal line 42. The plurality of first signal lines 41 may be disposed in the display region 10. The second signal line 42 may include a first sub-portion 421 and a second sub-portion 422. The first sub-portion 421 may be disposed in the display region 10, and the second sub-portion 422 may be disposed in the first non-display region 21. The plurality of signal lines 40 may be extended along the second direction Y, and the first direction X may intersect with the second direction Y. In other words, the plurality of gate lines 30 may intersect with the plurality of signal lines 40. FIG. 4 illustrates a case where the first direction X is perpendicular to the second direction Y, and in practical applications, the first direction X may not be perpendicular to the second direction Y according to various applications, which is not limited by the present disclosure.

The second trace portion 312 in the first non-display region 21 may have the line width smaller than the first trace portion 311 in the display protrusion portion 13. In existing array substrate, when both the line widths of the first sub-portion 421 and the second sub-portion 422 in the second signal line 42 are the same as the line width of the first signal line 41, an intersection between the second sub-portion 422 and the second trace portion 312 may have an area smaller than an intersection between the first signal line 41 and the first trace portion 311. Accordingly, the intersection between the second sub-portion 422 and the second trace portion 312 may have a load capacitance smaller than the intersection between the first signal line 41 and the first trace portion 311, and the second signal line 42 may have the load capacitance smaller than the first signal line 41, which may cause uneven display along the vertical direction of the display panel.

In view of this, in the disclosed embodiments, in the second signal line 42, the second sub-portion 422 may be configured to have the line width greater than the first sub-portion 421, such that the load capacitance of the second sub-portion 422 in the second signal line 42 may increase. Accordingly, the load capacitance of the second signal line 42 may be increased and may be consistent with the load capacitance of the first signal line 41, which may suppress uneven display along the vertical direction of the display panel, improve the uniformity of the display panel, and improve the display performance of the display panel.

In one embodiment, referring to FIG. 4, a sum of areas of intersections between the first signal line 41 and all the gate lines 30 is S1, and a sum of areas of intersections between the second signal line 42 and all the gate lines 30 is S2, where S1=S2.

The sum of areas of the intersections between the first signal line 41 and all the gate lines 30 may be a sum of areas of intersections between the first signal line 41 and all the regular gate lines 31 as well as all the first trace portions 311 intersected with the first signal line 41. The sum of areas of the intersections between the second signal line 42 and all the gate lines 30 may include a sum of areas of intersections between the first sub-portion 421 in the second signal line 42 and all the regular gate lines 31 intersected with the first sub-portion 421 and a sum of areas of intersections between the second sub-portion 422 in the second signal line 42 and all the second trace portions 312 intersected with the second sub-portion 422. The sum of areas of the intersections between the first signal line 41 and all the gate lines 30 may be equal to the sum of areas of the intersections between the second signal line 42 and all the gate lines 30, such that the first signal line 41 may have the same load capacitance as the second signal line 42.

Figure 5:
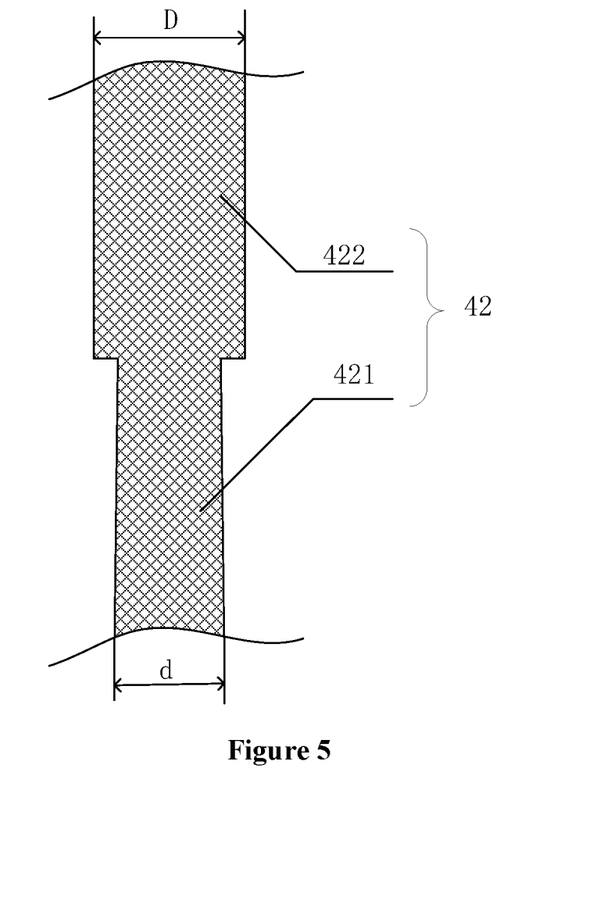
FIG. 5 illustrates a schematic diagram of a local structure of a second signal line in another exemplary array substrate consistent with disclosed embodiments of the present disclosure.

FIG. 5 illustrates a schematic diagram of a local structure of a second signal line in another array substrate consistent with disclosed embodiments of the present disclosure. In one embodiment, referring to FIG. 4 and FIG. 5, the line width of the second sub-portion 422 is D, and the line width of the first sub-portion 421 is d, where D−d≥0.5 μm, and D>d>0.

The second trace portion 312 in the first non-display region 21 may have the line width smaller than the first trace portion 311 in the display protrusion portion 13. In the second signal line 42, the second sub-portion 422 may have the line width greater than the first sub-portion 421. Accordingly, the load capacitance of the second signal line 42 may be increased and may be consistent with the load capacitance of the first signal line 41, which may suppress the uneven display along the vertical direction of the display panel, improve the uniformity of the display panel, and improve the display performance of the display panel. In one embodiment, in the second signal line 42, the line width of the second sub-portion 422 may be 0.5 μm greater than the line width of the first sub-portion 421.

Figure 6:
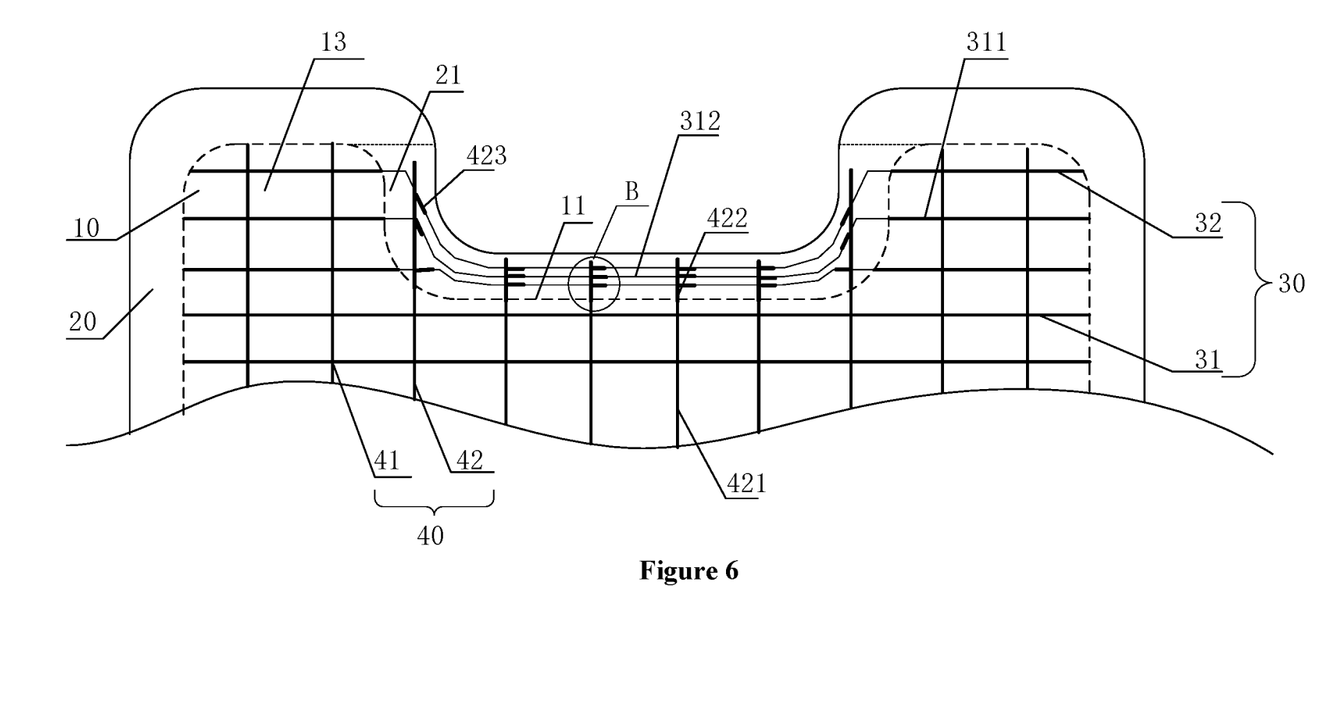
FIG. 6 illustrates a schematic diagram of a local structure of another exemplary array substrate consistent with disclosed embodiments of the present disclosure.
Figure 7:
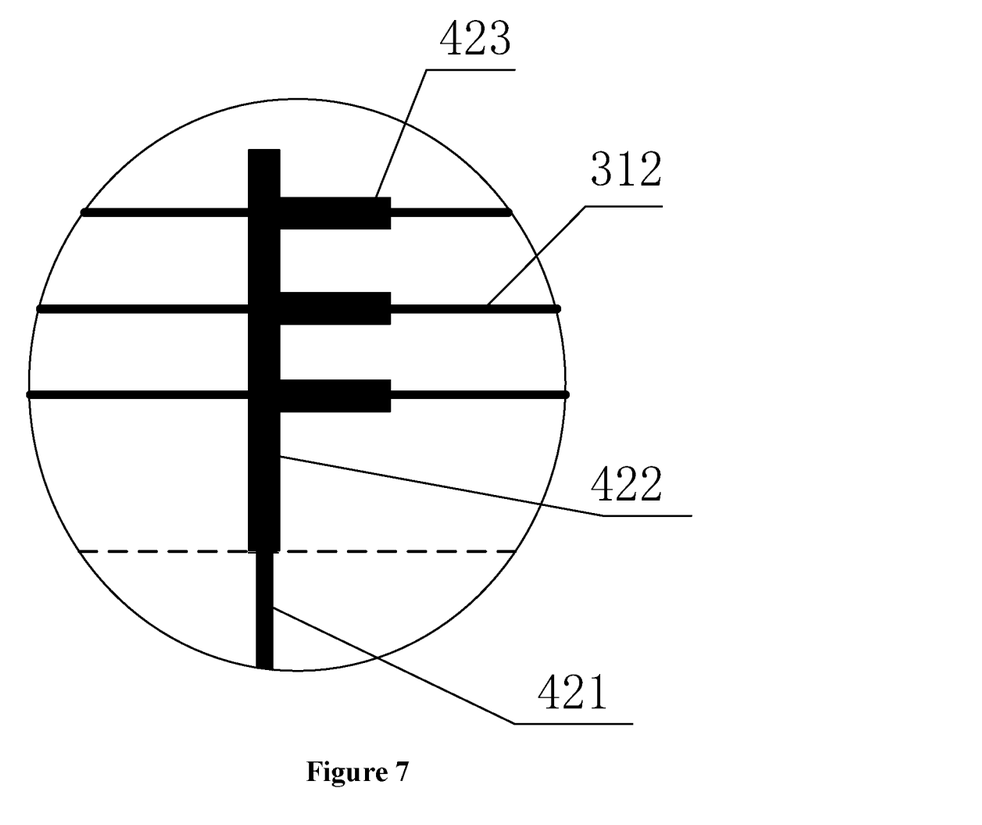
FIG. 7 illustrates an enlarged view of part B of another exemplary array substrate in FIG. 6 consistent with disclosed embodiments of the present disclosure.

FIG. 6 illustrates a schematic diagram of a local structure of another exemplary array substrate consistent with disclosed embodiments of the present disclosure, and FIG. 7 illustrates an enlarged view of a part B of another exemplary array substrate in FIG. 6. In one embodiment, referring to FIG. 6 and FIG. 7, the second signal line 42 may further include at least one conductive portion 423 disposed in the first non-display region 21. The conductive portion 423 may be electrically connected to the second sub-portion 422. In a direction perpendicular to the array substrate, the conductive portion 423 may overlap with the second trace portion 312.

In particular, referring to FIG. 6, the second trace portion 312 in the first non-display region 21 may have the line width smaller than the first trace portion 311 in the display protrusion portion 13. To enable the load capacitance of the second signal line 42 to be consistent with the load capacitance of the first signal line 41, in the second signal line 42, the second sub-portion 422 may have the line width greater than the first sub-portion 421. In practical applications, substantially large difference between the line widths of the second sub-portion 422 and the first sub-portion 421 in the second signal line 42 may increase the fabrication difficulty. Substantially small difference between the line widths of the second sub-portion 422 and the first sub-portion 421 in the second signal line 42 may cause the compensation of the load capacitance of the second signal line 42 to be substantially small, and, thus, the load capacitance of the second signal line 42 may be smaller than the load capacitance of the first signal line 41.

The second signal line 42 may further include at least one conductive portion 423. FIG. 6 illustrates a case where the second signal line 42 includes three conductive portions 423, and in practical applications, the second signal line 42 may also include any appropriate quantities of the conductive portions 423 according to various applications, which is not limited by the present disclosure. The conductive portion 423 may be electrically connected to the second sub-portion 422, and may overlap with the second trace portion 312. The load capacitance of the second sub-portion 422 in the second signal line 42 may be compensated by the overlap between the conductive portion 423 and the second trace portion 312. Accordingly, the load capacitance of the second signal line 42 may be increased and may be consistent with the load capacitance of the first signal line 41, which may suppress the uneven display in the vertical direction of the display panel, improve uniformity of the display panel, and improve the display performance of the display panel.

Figure 8:
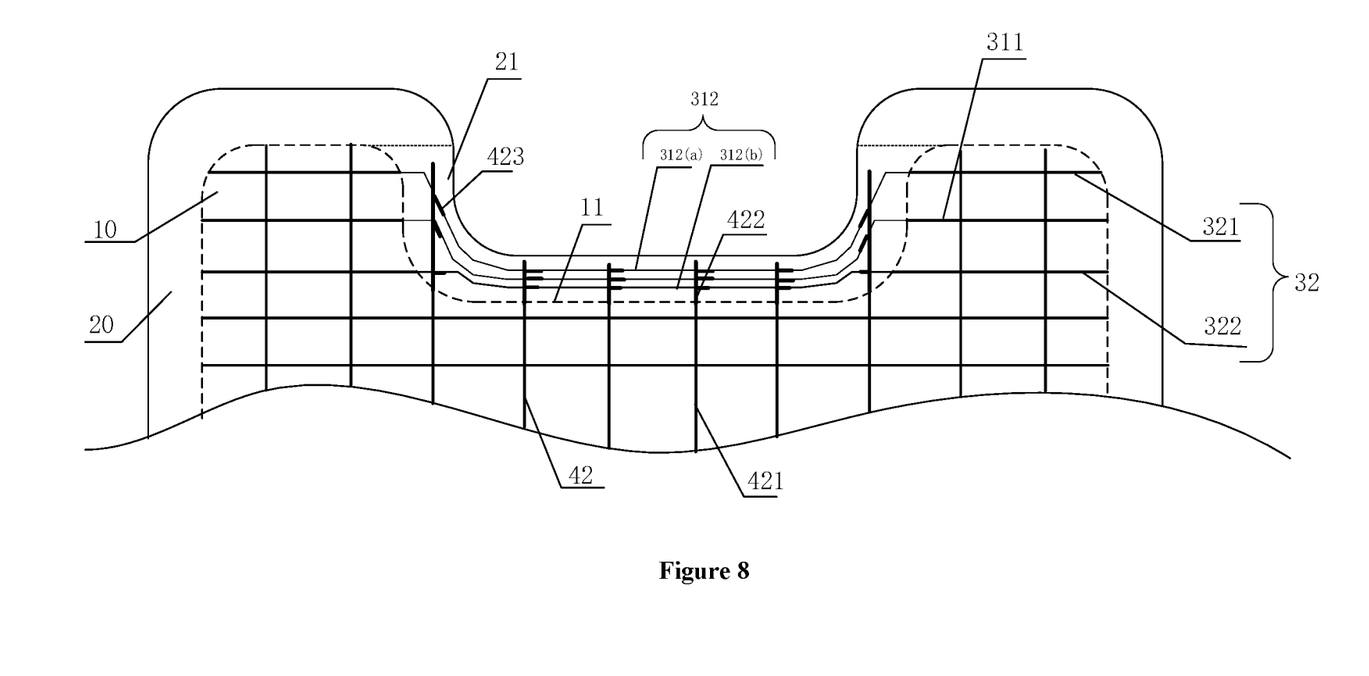
FIG. 8 illustrates a schematic diagram of a local structure of another exemplary array substrate consistent with disclosed embodiments of the present disclosure.

FIG. 8 illustrates a schematic diagram of a local structure of another exemplary array substrate consistent with disclosed embodiments of the present disclosure. In one embodiment, referring to FIG. 6 and FIG. 8, the conductive portion 423 may be extended along a length direction of the second trace portion 312 overlapped with the conductive portion 423.

In particular, referring to FIG. 6, the second signal line 42 may further include at least one conductive portion 423 disposed in the first non-display region 21. The conductive portion 423 may be electrically connected to the second sub-portion 422. In the direction perpendicular to the array substrate, the conductive portion 423 may overlap with the second trace portion 312, and the conductive portion 423 may be extended along the length direction of the second trace portion 312 overlapped with the conductive portion 423.

The conductive portion 423 may be extended along the length direction of the second trace portion 312 overlapped with the conductive portion, such that an area of the intersection between the conductive portion 423 and the second trace portion 312 may be maximized. Accordingly, the increase of the load capacitance of the second sub-portion 422 in the second signal line 42 may be maximized through the conductive portion 423, which may effectively reduce the difference between the line widths of the second sub-portion 422 and the first sub-portion 421 in the second signal line 42, and reduce the fabrication difficulty of the second signal line 42.

Referring to FIG. 8, both the first irregular gate line 321 and the second irregular gate line 322 may be the irregular gate lines 32. The second trace portion 312 (a) of the first irregular gate line 321 and the second trace portion 312 (b) of the second irregular gate line 322 may be disposed in the first non-display region 21. The second trace portion 312 (a) of the first irregular gate line 321 may have the line width smaller than the second trace portion 312 (b) of the second irregular gate line 322. The intersection between the second sub-portion 422 in the second signal line 42 and the second trace portion 312 (*a*) may have an area smaller than the intersection between the second sub-portion 422 in the second signal line 42 and the second trace portion 312 (*b*), which may affect the adjustment of the load capacitance of the second sub-portion 422 in the second signal line 42.

Through configuring the length of the conductive portion 423 at the intersection with the second trace portion 312 (*a*) to be greater than the length of the conductive portion 423 at the intersection with the second trace portion 312 (*b*), the intersection between the second sub-portion 422 in the second signal line 42 and the second trace portion 312 (*a*) may have the same area as the intersection between the second sub-portion 422 in the second signal line 42 and the second trace portion 312 (*b*). Therefore, the load capacitance of the second signal line 42 may be conveniently adjusted by configuring the length of the conductive portion 423. When the second trace portion 312 (*a*) of the first irregular gate line 321 has the line width smaller than the second trace portion 312 (*b*) of the second irregular gate line 322, the load capacitance of the second signal line 42 may be consistent with the load capacitance of the first signal line 41, which may suppress the uneven display along the vertical direction of the display panel, improve the uniformity of the display panel, and improve the display performance of the display panel.

In one embodiment, referring to FIG. 6, the conductive portion 423 may be made of a same material as the second sub-portion 422, and the conductive portion 423 may be provided at a same layer as the second sub-portion 422. In other words, the conductive portion 423 and the second sub-portion 422 may be formed using a same material in a same manufacturing process. Both the conductive portion 423 and the second sub-portion 422 may overlap with the second trace portion 312 to compensate for the load capacitance of the second signal line 42. The material and specific structure of the conductive portion 423 may be determined according to specific design demand of the display panel, and are not repeated herein.

Figure 9:
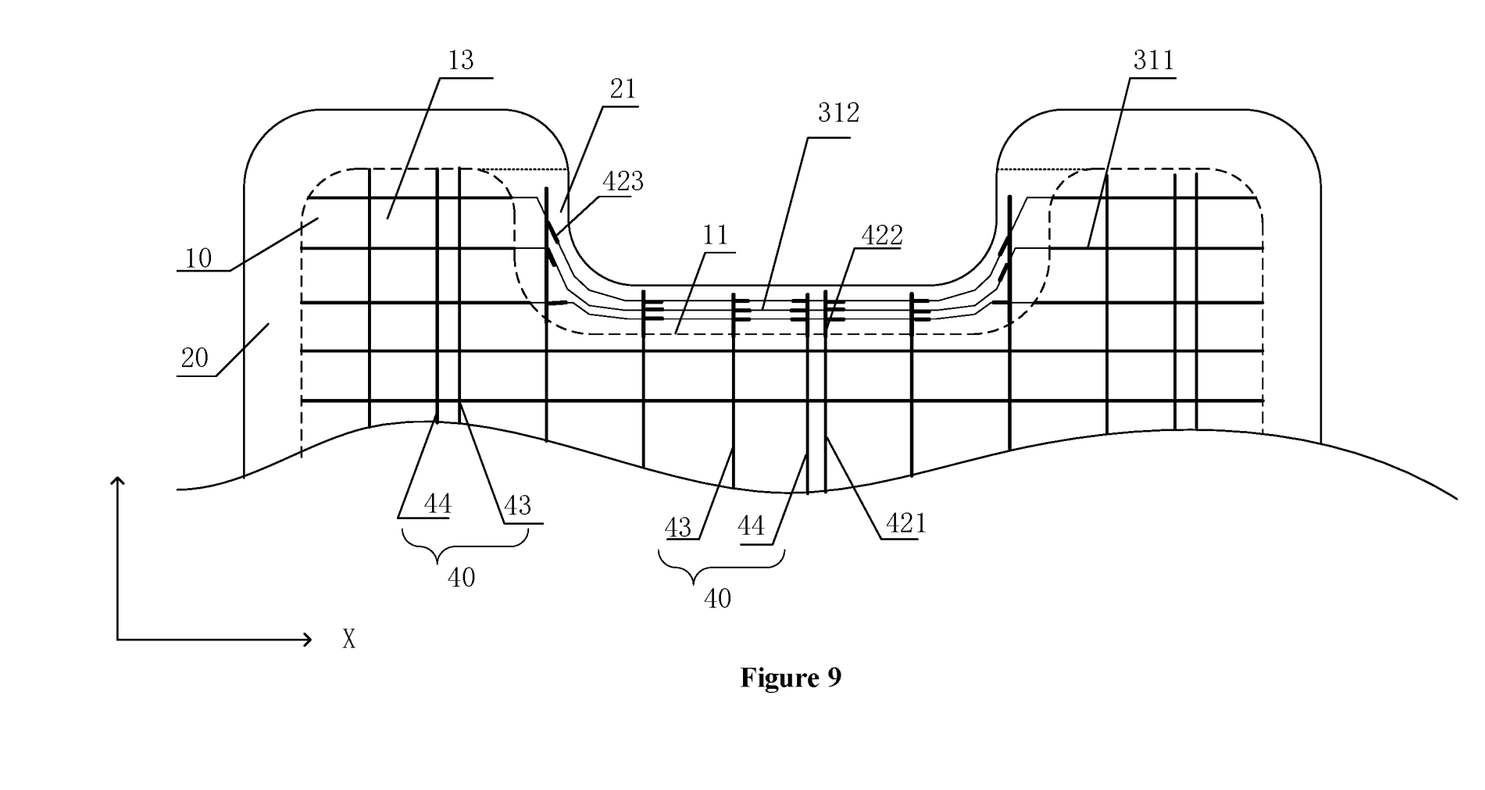
FIG. 9 illustrates a schematic diagram of a local structure of another exemplary array substrate consistent with disclosed embodiments of the present disclosure.
Figure 10:
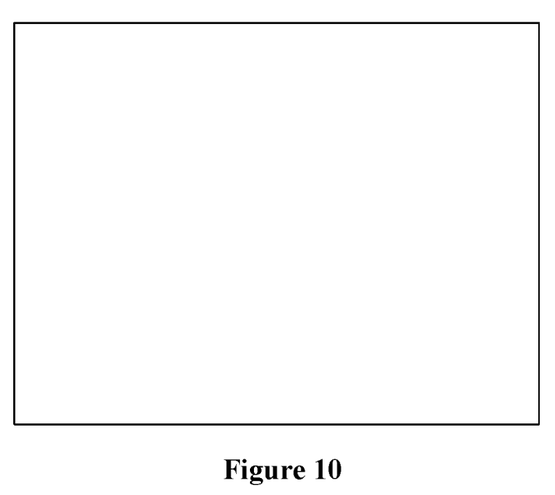
FIG. 10 illustrates a schematic diagram of an exemplary display panel consistent with disclosed embodiments of the present disclosure.
Figure 11:
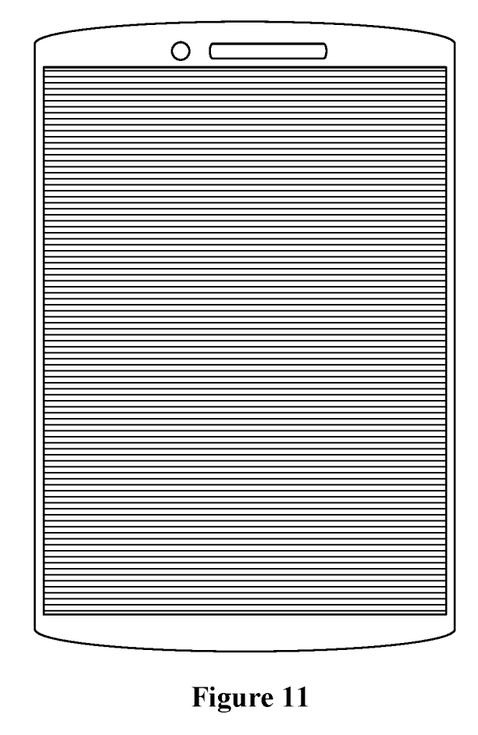
FIG. 11 illustrates a schematic diagram of an exemplary display device consistent with disclosed embodiments of the present disclosure.

FIG. 9 illustrates a schematic diagram of a local structure of another exemplary array substrate consistent with disclosed embodiments of the present disclosure. In one embodiment, referring to FIG. 9, the signal lines 40 may further include at least one of a data line 43 and a touch line 44.

The array substrate may be embedded with a touch control structure, e.g., a self-capacitive touch control structure. The common electrodes may be multiplexed as a plurality of touch control electrodes. The touch control electrodes may be connected to an external driving circuit through touch control wires, respectively, to realize the touch control function.

In one embodiment, referring to FIG. 9, the array substrate may include the display region 10 and the non-display region 20. The non-display region 20 may include the first non-display region 21. The second trace portion 312 in the non-display region 21 may have the line width smaller than the first trace portion 311 in the display protrusion portion 13. The array substrate may also include the plurality of signal lines 40. The signal lines 40 may include the data lines 43 and the touch lines 44. In the signal lines 40, at least one of the data line 43 and the touch line 44 may include a first sub-portion 421 and a second sub-portion 422. The first sub-portion 421 may be disposed in the display region 10, and the second sub-portion 422 may be disposed in the first non-display region 21. The second signal line 42 may include at least one conductive portion 423 disposed in the first non-display region 21. The conductive portion 423 may be electrically connected to the second sub-portion 422. In the direction perpendicular to the array substrate, the conductive portion 423 may overlap with the second trace portion 312.

Those skilled in the art may understand that the signal lines 40 may include the data lines 43 and the touch lines 44, which are for illustrative purposes and are not intended to limit the scope of the present application. In practical applications, the signal lines 40 may include any appropriate type of lines according to various application scenarios.

Further, the array substrate may further include a second edge 50. The second edge 50 may be recessed toward the interior of the array substrate to form a notch portion 60 and at least one protrusion portion 70 in the array substrate. The second edge 50 and the first edge 11 may be disposed at a same side of the display region 10.

In one embodiment, referring to FIG. 4, the array substrate may further include the second edge 50. The second edge 50 may be recessed toward the interior of the array substrate to form one notch portion 60 and two protrusion portions 70. The notch portion 60 may be disposed between the two protrusion portions 70. FIG. 4 illustrates the array substrates includes two protrusion portions 70 which are for illustrative purposes and are not intended to limit the scope of the present application. In practical applications, any appropriate quantities of the protrusion portions 70 may be provided in the array substrate according to various applications.

The present disclosure further provides a display panel. The display panel may include any one of the disclosed array substrates. The display panel may be, for example, a liquid crystal display panel or an organic light-emitting display panel, further, the display panel may be any appropriate display panel according to various application scenarios. Those skilled in the art may understand that the display panel in the present disclosure may also include other well-known structures in addition to the array substrate.

The present disclosure further provides a display device. The display device may include any one of the disclosed display panels. The display device in the present disclosure may also include other well-known structures in addition to the display panel, which are not further described here. The display device may be a mobile phone, a computer, a television, a car display device, an electronic book, or any appropriate display device having a display function, which is not limited by the present disclosure.

In the array substrate, the display panel and the display device provided by the present disclosure, the second trace portion of the irregular gate line may be configured to have the line width smaller than the first trace portion of the irregular gate line. In other words, the second trace portion may be configured to have the line width smaller than the regular gate line, such that the resistance of the second trace portion may increase. Accordingly, the load capacitance of the irregular gate line may be increased, and the regular gate line may have the same load capacitance as the irregular gate line, which may improve the uniformity of the display panel, and improving the display performance of the display panel.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments illustrated herein but is to be accorded the widest scope consistent with the principles and novel features disclosed herein.

What is claimed is:

1. An array substrate, comprising:
a display region and a non-display region surrounding the display region, wherein:
the display region includes a first edge, and the first edge is recessed toward interior of the display region to form a display notch portion and at least one display protrusion portion,
the non-display region includes a first non-display region arranged adjacent to the first edge; and
a plurality of gate lines, wherein:
the plurality of gate lines include a plurality of regular gate lines and at least one irregular gate line,
the plurality of regular gate lines are disposed in the display region and extended along a first direction,
the at least one irregular gate line includes at least one first trace portion and a second trace portion electrically connected to each other,
the at least one first trace portion is disposed in the display protrusion portion and extended along the first direction, and the second trace portion is disposed in the first non-display region, and
the at least one first trace portion has a same line width as a regular gate line of the plurality of regular gate lines, and the second trace portion has a line width smaller than the at least one first trace portion.

2. The array substrate according to claim 1, further including:
a plurality of irregular gate lines, wherein:
the plurality of irregular gate lines include at least one first irregular gate line and at least one second irregular gate line,
a first trace portion of the at least one first irregular gate line has a length smaller than a first trace portion of the at least one second irregular gate line, and
a second trace portion of the at least one first irregular gate line has a line width smaller than a second trace portion of the at least one second irregular gate line.

3. The array substrate according to claim 2, wherein:
the second trace portion of the at least one second irregular gate line has the line width of approximately 4 µm; and
the second trace portion of the at least one first irregular gate line has the line width in a range of approximately 3 µm-3.5 µm.

4. The array substrate according to claim 1, further including:
a plurality of signal lines, wherein:
the plurality of signal lines are extended along a second direction, and the first direction intersects with the second direction,
the plurality of signal lines include a plurality of first signal lines and a second signal line,
the plurality of first signal lines are disposed in the display region,
the second signal line includes a first sub-portion and a second sub-portion, the first sub-portion is disposed in the display region, and the second sub-portion is disposed in the first non-display region, and
a first signal line of the plurality of first signal lines has a same line width as the first sub-portion of the second signal line, and the second sub-portion of the second signal line has a line width greater than the first sub-portion of the second signal line.

5. The array substrate according to claim 4, wherein:
a sum of areas of intersections between the first signal line and all the gate lines is S1, and a sum of areas of intersections between the second signal line and all the gate lines is S2, wherein S1=S2.

6. The array substrate according to claim 4, wherein:
the line width of the second sub-portion of the second signal line is D, and the line width of the first sub-portion of the second signal line is d, wherein D−d≥0.5 µm, and D>d>0.

7. The array substrate according to claim 4, wherein:
the second signal line further includes at least one conductive portion disposed in the first non-display region, wherein:
the at least one conductive portion is electrically connected to the second sub-portion of the second signal line, and
in a direction perpendicular to the array substrate, the at least one conductive portion overlaps with the second trace portion.

8. The array substrate according to claim 7, wherein:
the at least one conductive portion is extended along a length direction of the second trace portion which is overlapped with the at least one conductive portion.

9. The array substrate according to claim 7, wherein:
the at least one conductive portion is made of a same material as the second sub-portion of the second signal line; and
the at least one conductive portion is provided at a same layer as the second sub-portion of the second signal line.

10. The array substrate according to claim 4, wherein:
the plurality of signal lines further include at least one of a data line and a touch line.

11. The array substrate according to claim 1, further including:
a second edge, wherein:
the second edge is recessed toward the interior of the array substrate to form a notch portion and at least one protrusion portion in the array substrate, and
the second edge and the first edge are disposed at a same side of the display region.

12. A display panel, comprising:
an array substrate, wherein the array substrate comprises:
a display region and a non-display region surrounding the display region, wherein:
the display region includes a first edge, and the first edge is recessed toward interior of the display region to form a display notch portion and at least one display protrusion portion,
the non-display region includes a first non-display region arranged adjacent to the first edge; and
a plurality of gate lines, wherein:
the plurality of gate lines include a plurality of regular gate lines and at least one irregular gate line,
the plurality of regular gate lines are disposed in the display region and extended along a first direction,
the at least one irregular gate line includes at least one first trace portion and a second trace portion electrically connected to each other,
the at least one first trace portion is disposed in the display protrusion portion and extended along the first direction, and the second trace portion is disposed in the first non-display region, and
the at least one first trace portion has a same line width as a regular gate line of the plurality of regular gate lines, and the second trace portion has a line width smaller than the at least one first trace portion.

13. The display panel according to claim 12, wherein:
the array substrate further includes a plurality of irregular gate lines, wherein:
the plurality of irregular gate lines include at least one first irregular gate line and at least one second irregular gate line,
a first trace portion of the at least one first irregular gate line has a length smaller than a first trace portion of the at least one second irregular gate line, and
a second trace portion of the at least one first irregular gate line has a line width smaller than a second trace portion of the at least one second irregular gate line.

14. The display panel according to claim 12, wherein:
the array substrate further includes a plurality of signal lines, wherein:
the plurality of signal lines are extended along a second direction, and the first direction intersects with the second direction,
the plurality of signal lines include a plurality of first signal lines and a second signal line,
the plurality of first signal lines are disposed in the display region,
the second signal line includes a first sub-portion and a second sub-portion, the first sub-portion is disposed in the display region, and the second sub-portion is disposed in the first non-display region, and
a first signal line of the plurality of first signal lines has a same line width as the first sub-portion of the second signal line, and the second sub-portion of the second signal line has a line width greater than the first sub-portion of the second signal line.

15. A display device, comprising:
a display panel, wherein the display panel includes an array substrate, including:
a display region and a non-display region surrounding the display region, wherein:
the display region includes a first edge, and the first edge is recessed toward interior of the display region to form a display notch portion and at least one display protrusion portion,
the non-display region includes a first non-display region arranged adjacent to the first edge; and
a plurality of gate lines, wherein:
the plurality of gate lines include a plurality of regular gate lines and at least one irregular gate line,
the plurality of regular gate lines are disposed in the display region and extended along a first direction,
the at least one irregular gate line includes at least one first trace portion and a second trace portion electrically connected to each other,
the at least one first trace portion is disposed in the display protrusion portion and extended along the first direction, and the second trace portion is disposed in the first non-display region, and
the at least one first trace portion has a same line width as a regular gate line of the plurality of regular gate lines, and the second trace portion has a line width smaller than the at least one first trace portion.

16. The display device according to claim 15, wherein:
the array substrate further includes a plurality of irregular gate lines, wherein:
the plurality of irregular gate lines include at least one first irregular gate line and at least one second irregular gate line,
a first trace portion of the at least one first irregular gate line has a length smaller than a first trace portion of the at least one second irregular gate line, and
a second trace portion of the at least one first irregular gate line has a line width smaller than a second trace portion of the at least one second irregular gate line.

17. The display device according to claim 15, wherein:
the array substrate further includes a plurality of signal lines, wherein:
the plurality of signal lines are extended along a second direction, and the first direction intersects with the second direction,
the plurality of signal lines include a plurality of first signal lines and a second signal line,
the plurality of first signal lines are disposed in the display region,
the second signal line includes a first sub-portion and a second sub-portion, the first sub-portion is disposed in the display region, and the second sub-portion is disposed in the first non-display region, and
a first signal line of the plurality of first signal lines has a same line width as the first sub-portion of the second signal line, and the second sub-portion of the second signal line has a line width greater than the first sub-portion of the second signal line.

* * * * *